United States Patent [19]

Polansky

[11] Patent Number: 4,659,006

[45] Date of Patent: Apr. 21, 1987

[54] METHOD OF BONDING A DIE TO A SUBSTRATE

[75] Inventor: Carl Polansky, Landisville, Pa.

[73] Assignee: RCA Corporation, Princeton, N.J.

[21] Appl. No.: 780,299

[22] Filed: Sep. 26, 1985

[51] Int. Cl.$^4$ .................. B23K 1/20; B23K 31/00
[52] U.S. Cl. ................... 228/123; 228/203; 228/232; 228/254
[58] Field of Search ............. 228/123, 203, 232, 253, 228/254

[56] References Cited

U.S. PATENT DOCUMENTS

| | | | |
|---|---|---|---|
| 3,611,555 | 10/1971 | Nier | 228/123 |
| 3,641,663 | 2/1972 | Osoegawa et al. | 228/123 |
| 3,883,496 | 5/1975 | Dale | 228/123 |
| 4,142,662 | 3/1979 | Holbrook | 228/123 |
| 4,328,491 | 5/1982 | Liang | 228/254 |

FOREIGN PATENT DOCUMENTS

| | | | |
|---|---|---|---|
| WO82/02457 | 7/1982 | PCT Int'l Appl. | 228/123 |
| 865658 | 4/1961 | United Kingdom | 228/232 |

*Primary Examiner*—Kenneth J. Ramsey
*Assistant Examiner*—Christopher L. McKee
*Attorney, Agent, or Firm*—B. E. Morris; W. J. Burke; R. H. Swope

[57] ABSTRACT

A typical method for bonding a die to a substrate includes the steps of placing a solder preform onto the substrate, contacting the die to the preform and applying heat sufficient for the solder to flow and wet the substrate and die forming a bond therebetween. The present invention comprises heating the substrate and preform to a temperature below the melting point of the solder preform and thereafter maintaining this temperature while applying pressure to the preform sufficient to substantially reduce the thickness of the preform and to cause the preform to adhere to the substrate prior to contacting the die thereto.

6 Claims, No Drawings

METHOD OF BONDING A DIE TO A SUBSTRATE

This invention relates to a method of bonding a die to a substrate and more particularly to a method of attaching a solder preform to the substrate.

BACKGROUND OF THE INVENTION

In the manufacture of a semiconductor device, a semiconductor die is bonded to a substrate such as a copper heatsink or a metallized ceramic intermediary. Typically, a bonding material, such as a tin solder, is interposed the die and substrate to bond the two bodies. In production applications where die bonding machines are used, solder preforms, comprising prefabricated tablets of the solder material, are employed to enable automation of the entire process.

Several problems exist using solder preforms, particularly with small, fragile semiconductor devices such as facet-emitting lasers and LEDs. The smallest preforms are generally about 25 micrometers ($\mu$m) thick and are typically bowed due to uneven cooling during their fabrication. Preforms of this thickness generally result in the presence of solder on the die facets after bonding. Heating the substrate and solder beyond the solder melting point is effective in thinning out the solder but creates other problems. For example, when a tin solder preform is wetted to the substrate metallized with gold preparatory to die bonding, gold-tin intermetallic compounds are formed which are known to adversely affect the physical, electrical and thermal properties of the subsequent bond to the die.

Therefore, an improved method of bonding a semiconductor die to a substrate has been sought.

SUMMARY OF THE INVENTION

A typical method for bonding a die to a substrate includes the steps of placing a solder preform onto the substrate, contacting the die to the preform and applying heat sufficient for the solder to flow and wet the substrate and die forming a bond therebetween. The present invention comprises heating the substrate and preform to a temperature below the melting point of the solder preform and thereafter maintaining this temperature while applying pressure to the preform sufficient to substantially reduce the thickness of the preform and to cause the preform to adhere to the substrate prior to contacting the die thereto.

DETAILED DESCRIPTION OF THE PREFERRED EMBODIMENTS

While the present method can be carried out by any convenient means, it will be described using a die bonding machine, well known in the art, comprising a workstage with heating means, a preform collet, and a die collet.

The substrate, which may be a copper heatsink, a stud mount, a ceramic intermediary, or the like, is typically metallized, e.g. with nickel and gold and is secured to the workstage. The substrate is preferably heated to a temperature equal to or greater than the softening point of a solder preform to be interposed the die and the substrate. The softening point is defined as a temperature below the melting point where the solder material becomes noticeably softer and more malleable than at room temperature and where the preform becomes somewhat tacky on its outer surface. For example, tin has a melting point of 232° C. It is usually heated above its melting point, i.e. to a temperature between about 250° C. and 270° C., to cause it to flow during bonding. When the tin is heated above about 200° C., but below 232° C., it softens and becomes tacky on its outer surface without melting or flowing.

A tin preform is placed on the heated substrate using the preform collet. Alternatively, the substrate and preform may be heated together. Pressure is applied through the preform collet to the preform sufficient to flatten and thin the preform. Typically, a 25 $\mu$m thick tin preform is reduced to a thickness of between about 10 and 15 $\mu$m. This constitutes a reduction in preform thickness between 60% and 40%. This thickness provides enhanced results in subsequent bonding by alleviating unwanted solder on the facet. Also, at this temperature the pressure and the preform tackiness provide a weak bond between the preform and the substrate. This is desirable because it keeps the preform in place during substrate transfer between the preform thinning and die bonding steps, but without actually melting the tin onto the gold coated substrate which would cause unwanted intermetallic compound formation. The preform thinning-attaching step can also be enhanced by carrying it out in a reducing atmosphere such as nitrogen or forming gas.

A semiconductor die mounted in the die collet is positioned over the substrate with the thinned preform attached thereto. The workstage temperature is increased to a temperature sufficient to cause the preform to flow, e.g. to between about 250° C. and 270° C. for tin solder. The die is then contacted to the solder and, preferably, scrubbed into the solder by known means. Thereafter, the substrate and die are cooled to form the bond therebetween.

The method of the present invention provides a high quality bond since the formation of intermetallic compounds between the solder and the substrate metallization are minimized during attachment of the preform to the substrate. Further, the preform is effectively thinned and attached to the substrate, resulting in a bonding method more suitable for facet-emitting devices.

I claim:

1. In a method of bonding a die to a substrate with a solder preform comprising the steps of:
    (a) placing the preform onto said substrate;
    (b) contacting the die with said preform; and,
    (c) melting the solder to form a bond between said die and said substrate;
    the improvement comprising heating the substrate and preform to a temperature below the melting point of the solder preform and thereafter maintaining said temperature while applying pressure to the preform sufficient to reduce the thickness of the preform by at least 40% and cause the preform to adhere to said substrate prior to step (b).

2. The method of claim 1 wherein the substrate and preform are heated to a temperature at least equal to a softening point for the solder on the improvement step.

3. The method of claim 2 wherein the solder preform is tin.

4. The method of claim 3 wherein the tin is heated to about 200° C.

5. The method of claim 1 wherein the improvement steps are carried out in a reducing atmosphere.

6. The method of claim 1 wherein the improvement further comprises heating the substrate to said temperature prior to applying the preform thereto.

* * * * *